(12) United States Patent
Cabral, Jr. et al.

(10) Patent No.: US 8,841,652 B2
(45) Date of Patent: Sep. 23, 2014

(54) SELF ALIGNED CARBIDE SOURCE/DRAIN FET

(75) Inventors: Cyril Cabral, Jr., Yorktown Heights, NY (US); Josephine B. Chang, Yorktown Heights, NY (US); Alfred Grill, Yorktown Heights, NY (US); Michael A. Guillorn, Yorktown Heights, NY (US); Christian Lavoie, Yorktown Heights, NY (US); Eugene J. O'Sullivan, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 137 days.

(21) Appl. No.: 12/627,120

(22) Filed: Nov. 30, 2009

(65) Prior Publication Data

US 2011/0127493 A1    Jun. 2, 2011

(51) Int. Cl.
| | |
|---|---|
| *H01L 29/08* | (2006.01) |
| *H01L 29/16* | (2006.01) |
| *H01L 29/775* | (2006.01) |
| *B82Y 10/00* | (2011.01) |
| *H01L 51/10* | (2006.01) |
| *H01L 51/00* | (2006.01) |
| *H01L 51/05* | (2006.01) |

(52) U.S. Cl.
CPC ........... *H01L 29/775* (2013.01); *H01L 51/0048* (2013.01); *H01L 29/16* (2013.01); *H01L 29/1602* (2013.01); *B82Y 10/00* (2013.01); *H01L 51/0541* (2013.01); *H01L 51/105* (2013.01)
USPC .............................................. 257/40; 438/99

(58) Field of Classification Search
USPC ................................................ 438/99; 257/40
See application file for complete search history.

(56) References Cited

U.S. PATENT DOCUMENTS

| | | | | |
|---|---|---|---|---|
| 5,382,822 | A | * | 1/1995 | Stein .............................. 257/410 |
| 5,559,367 | A | * | 9/1996 | Cohen et al. .................... 257/77 |
| 5,970,339 | A | * | 10/1999 | Choi .............................. 438/243 |
| 6,062,931 | A | | 5/2000 | Chuang et al. |
| 6,923,946 | B2 | | 8/2005 | Geohegan et al. |

(Continued)

FOREIGN PATENT DOCUMENTS

| | | |
|---|---|---|
| CN | 101099248 A | 1/2008 |
| JP | 2006245127 A | 9/2006 |
| JP | 2008084892 A | 10/2008 |
| WO | 2008121925 A2 | 10/2008 |

OTHER PUBLICATIONS

International Search Report and Written Opinion, Mailed Feb. 4, 2011, International Appln. No. PCT/EP2010/066817, Written Opinion 7 Pages, International Search Report 3 Pages.

(Continued)

*Primary Examiner* — Mark Tornow
(74) *Attorney, Agent, or Firm* — Cantor Colburn LLP; Vazken Alexanian

(57) ABSTRACT

A field effect transistor includes a metal carbide source portion, a metal carbide drain portion, an insulating carbon portion separating the metal carbide source portion from the metal carbide portion, a nanostructure formed over the insulating and carbon portion and connecting the metal carbide source portion to the metal carbide drain portion, and a gate stack formed on over at least a portion of the insulating carbon portion and at least a portion of the nanostructure.

10 Claims, 5 Drawing Sheets

(56) References Cited

U.S. PATENT DOCUMENTS

| | | |
|---|---|---|
| 6,949,237 B2 | 9/2005 | Smalley et al. |
| 7,105,428 B2 | 9/2006 | Pan et al. |
| 7,148,079 B1 | 12/2006 | Raman et al. |
| 7,357,906 B2 | 4/2008 | Colbert et al. |
| 7,399,691 B2 | 7/2008 | Lieber et al. |
| 7,425,487 B2 | 9/2008 | Kreupl et al. |
| 7,425,491 B2 | 9/2008 | Forbes |
| 7,534,675 B2 | 5/2009 | Bangsaruntip et al. |
| 7,566,945 B2 | 7/2009 | Choi et al. |
| 7,598,516 B2 * | 10/2009 | Avouris et al. ............ 257/27 |
| 7,858,989 B2 * | 12/2010 | Chen et al. ............ 257/76 |
| 2003/0178617 A1 | 9/2003 | Appenzeller et al. |
| 2004/0164327 A1 | 8/2004 | Shin et al. |
| 2005/0093425 A1 | 5/2005 | Sugiyama |
| 2006/0151844 A1 * | 7/2006 | Avouris et al. ............ 257/411 |
| 2006/0220028 A1 | 10/2006 | Shaheen et al. |
| 2007/0281409 A1 | 12/2007 | Zhang et al. |
| 2008/0067495 A1 | 3/2008 | Verhulst |
| 2008/0128760 A1 | 6/2008 | Jun et al. |
| 2008/0169563 A1 * | 7/2008 | Awano et al. ............ 257/746 |
| 2008/0277648 A1 | 11/2008 | Wakita |
| 2009/0169919 A1 * | 7/2009 | Garcia et al. ............ 428/688 |
| 2011/0110141 A1 | 5/2011 | Tran |

OTHER PUBLICATIONS

Non-final Office Action dated Sep. 9, 2011 for U.S. Appl. No. 12/627,057.

Di, Zengfeng, et al.; "Fabrication of Silicon-On-SiO2/Diamondlike-Carbon Dual Insulator Using Ion Cutting and Mitigation of Self-Heating Effects"; Applied Physics Letters, vol. 88, 14208; p. 1-4; 2006.

Quirk, M., et al.; "Semiconductor Manufacturing Technology"; Prentice Hall; p. 464-466; 2001.

* cited by examiner

SELF ALIGNED CARBIDE SOURCE/DRAIN FET

BACKGROUND

The present invention relates to switching devices and, more specifically, to field effect transistors (FETs) formed with carbide drains and sources.

Switching devices based on nanostructures such as carbon nanotubes, graphene, or semiconducting nanowires have potential due to the high carrier mobility and small dimensions that such nanostructures can provide. However, one of the many challenges a technology based on such nanostructures must overcome is compatibility with the high layout density that traditional silicon CMOS technology currently supports. For high layout density, the source/drain and gate contacts to the switching device built around each nanostructure must all be precisely positioned. In silicon CMOS, this precise positioning is enabled by using gate shadowing to define implanted junction profiles and by the self-aligned silicide process.

SUMMARY

According to one embodiment of the present invention, a field effect transistor is disclosed. The field effect transistor of this embodiment, a metal carbide source portion, a metal carbide drain portion, an insulating carbon portion separating the metal carbide source portion from the metal carbide portion. The field effect transistor also includes a nanostructure formed over the insulating and carbon portion and connecting the metal carbide source portion to the metal carbide drain portion and a gate stack formed on over at least a portion of the insulating carbon portion and at least a portion of the nano structure.

According to another embodiment a method of forming a field effect transistor is disclosed. The method of this embodiment includes forming a substrate; forming an insulating layer over the substrate; forming an insulating carbon layer over the substrate; depositing one or more nanostructures on an upper surface of the insulating carbon layer; covering at least a portion of the one or more nanostructures and any insulating carbon under the covered nanostructures with a gate stack; and converting exposed portions of the insulating carbon layer to a metal carbide.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

One embodiment of the present invention is directed to a self-aligned carbide source/drain contact formation process for a FET having a nanostructure based channel region. In particular, disclosed herein is a platform for building self-aligned devices from any deposited nanostructure, including carbon nanotubes, graphene, or semiconducting nanowires. The nanostructures are deposited on an insulating carbon underlayer, and a gate stack is patterned atop the nanostructures. Metal is then deposited everywhere. Any region of the carbon under-layer not protected by the gate stack is converted to a metal carbide contact, and the metal is then removed selectively to the metal carbide contacts, resulting in metal carbide source/drain contacts which are self-aligned to the gate stack.

Figure 1:
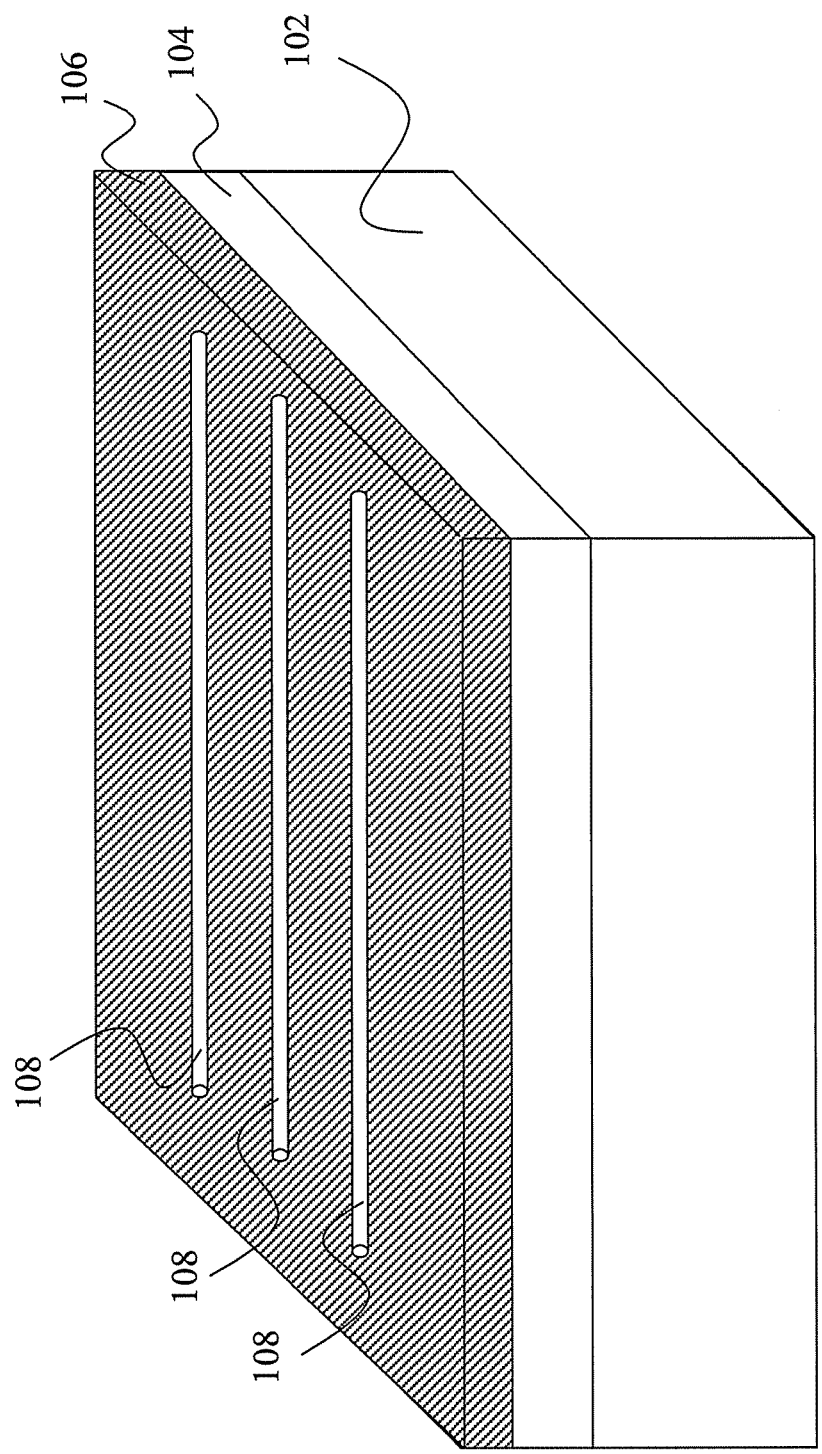
FIG. 1 shows an early stage in the production of FET according to one embodiment of the present invention.

With reference now to FIG. 1, an example of a wafer in the production process of a FET according to one embodiment of the present invention is shown. The wafer includes a substrate 102. The substrate 102 may be formed of any material but, in one embodiment, is formed of silicon or a silicon based material. An insulating layer 104 is formed on top of the substrate 102. The insulating layer 104 may be formed of any electrical insulator. In one embodiment, the insulating layer 104 is formed of a silicon nitride. In another embodiment, the insulating layer 104 is a Buried silicon OXide (BOX) layer.

A carbon layer 106 is formed over the insulating layer 104. As will be shown in greater detail below, both the source and drain of a FET is formed in this layer. In one embodiment, the carbon layer 106 is an insulating carbon layer that remains insulating even when exposed to high (greater than annealing) temperatures. One example of such an insulating carbon is a diamond based layer. The diamond based layer may be a crystalline film, a polycrystalline film, or a nano or ultranano crystalline diamond film. The diamond film may be deposited by a variety of chemical vapor deposition (CVD) processes including, without limitation, thermal, hot-wire or microwave assisted CVD. In one embodiment, the carbon layer may be a diamondlike, or an amorphous carbon material.

One or more nanostructures 108 are formed or deposited on top of the carbon layer 106. For example, the nanostructures 108 may be carbon nanotubes, graphene, or semiconducting nanowires. In one embodiment, the nanostructures 108 become conductive when voltage is applied to them and non-conductive otherwise. As shown in greater detail below, the nanostructures 108 form the channel of a FET in one embodiment.

Figure 2:
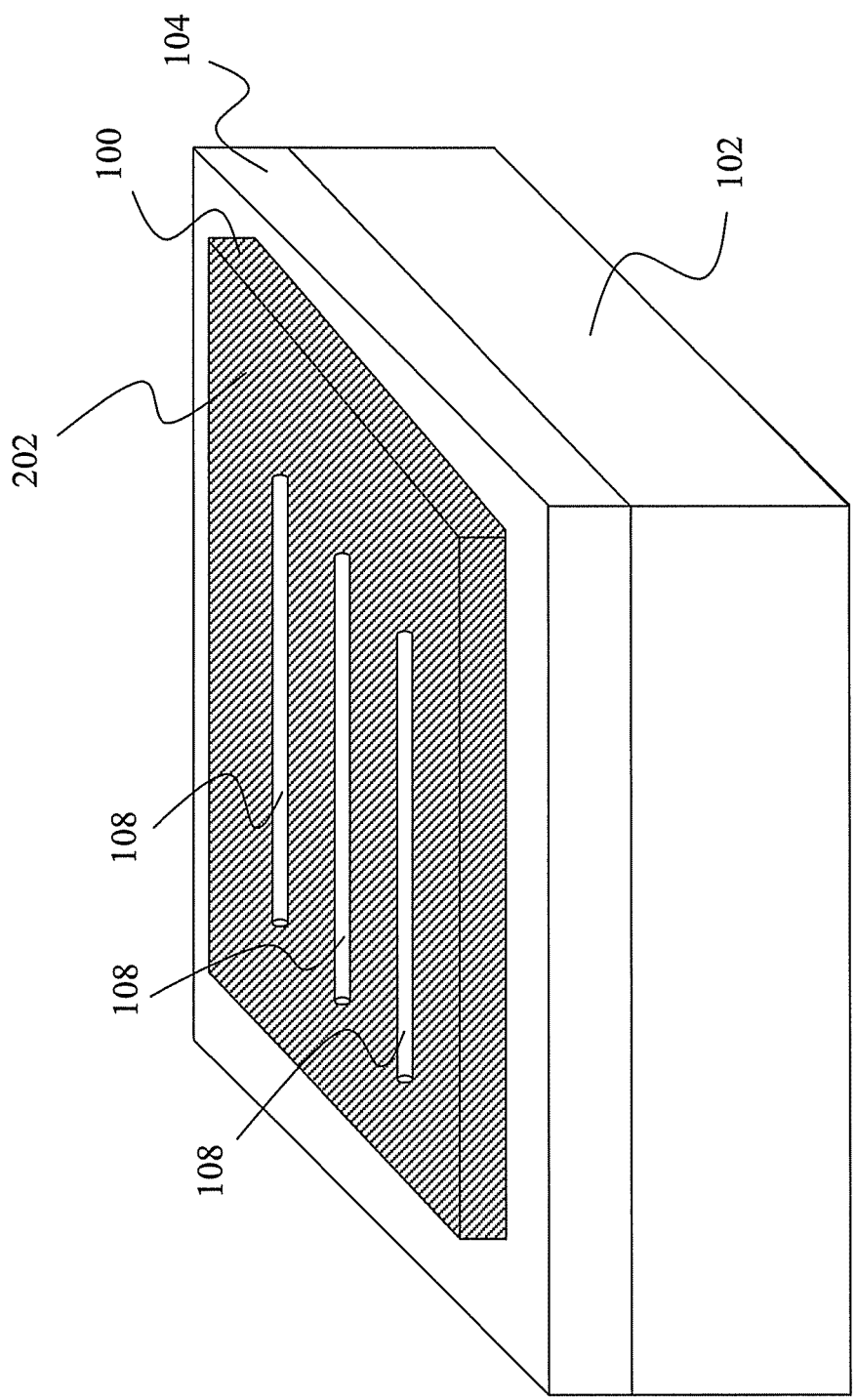
FIG. 2 shows the structure of FIG. 1 after an active region has been patterned into the carbon layer.

FIG. 2 shows the structure of FIG. 1 after an active region 202 has been patterned into the carbon layer 106. As shown, a disposable hard mask such as silicon dioxide may have been deposited and patterned over the active region, and then the exposed portions of the carbon layer 106 removed. Of course, the carbon layer 106 could have been formed as shown in FIG. 2 directly. Alternately, instead of removing the non-active regions of the carbon, the non-active regions of carbon could be covered by a hardmask such as silicon nitride.

Each active region 202 may be used to form one or more FETs. The number of nanostructures 108 is variable and may be one or more. It will be understood that the more nanostructures 108 used to form a channel, the more current the FET will carry in the "on" state.

Figure 3:
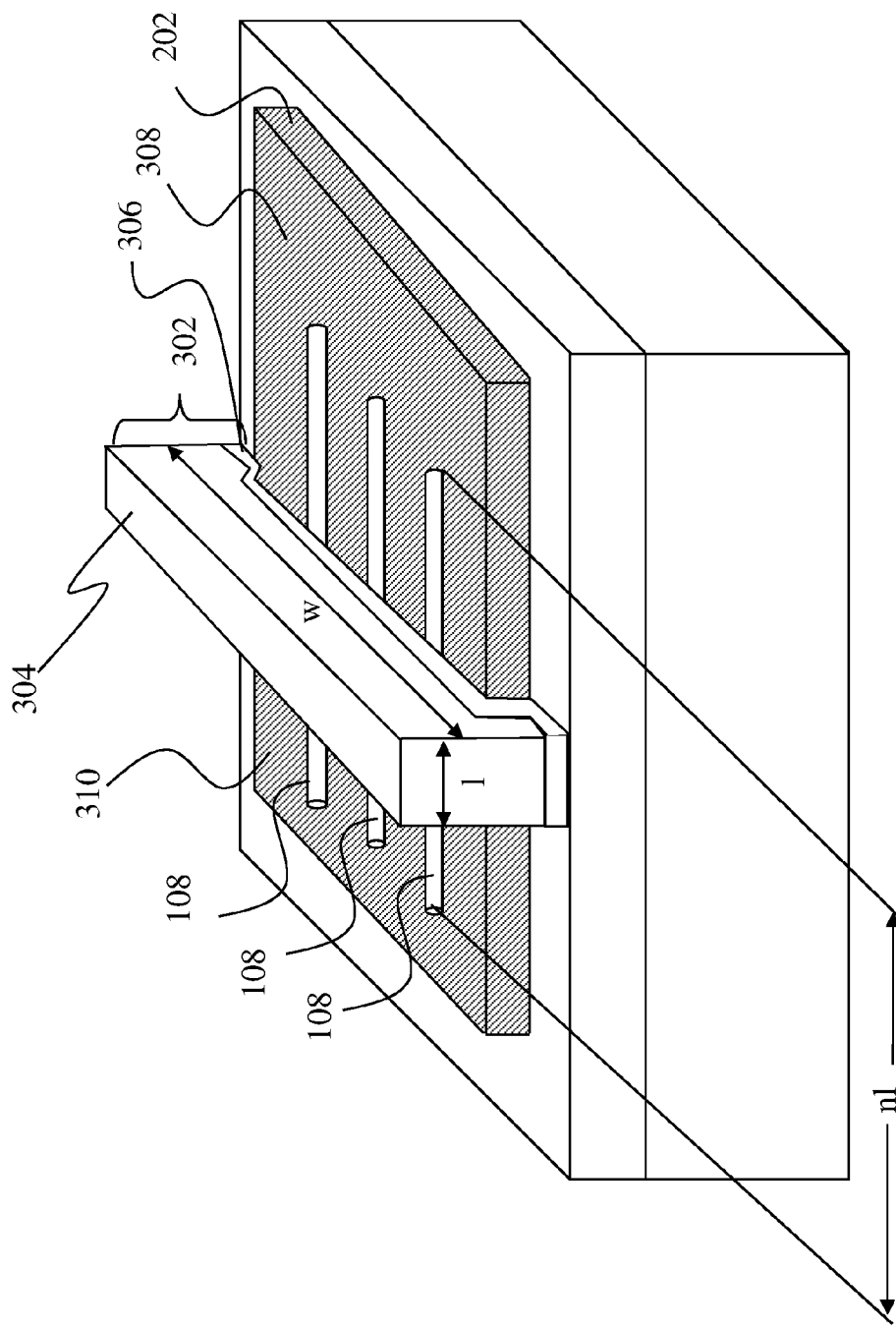
FIG. 3 shows the structure shown in FIG. 2 after a gate stack has been formed over a portion of the active region.

FIG. 3 shows the structure shown in FIG. 2 after a gate stack 302 has been formed over a portion of the active region 202. The gate stack 302 includes a gate dielectric layer 304. The dielectric layer 304 may be formed of any type of dielectric.

The gate stack 302 also includes a gate 306. The gate may be formed of any appropriate gate material, including polysilicon (which can be doped and/or silicided) and metal.

The orientation of the gate stack 302 may be varied. However, in one embodiment, the gate stack 302 is not parallel to one or more of the nanostructures 108. In one embodiment, the gate stack 302 has a length w and is disposed such that the l is substantially perpendicular to a nanostructure length n1. The angle between w and l is not limited and may vary from 1 to 179 degrees. The gate stack 302 preferably causes the active region to be divided into at least a first portion 308 and a second portion 310. It shall be understood that multiple gate stacks 302 may be placed on a single active region 202, forming stacked FETs, and that one gate stack 302 can run over multiple active regions 202, forming multiple FETs with gates that are tied together.

In one embodiment, the exposed portions of the nanostructures 108 may be modified at this point in the production run. The modification may include, but is not limited to, chemical doping or implanting and may vary depending on the circumstances.

Figure 4:
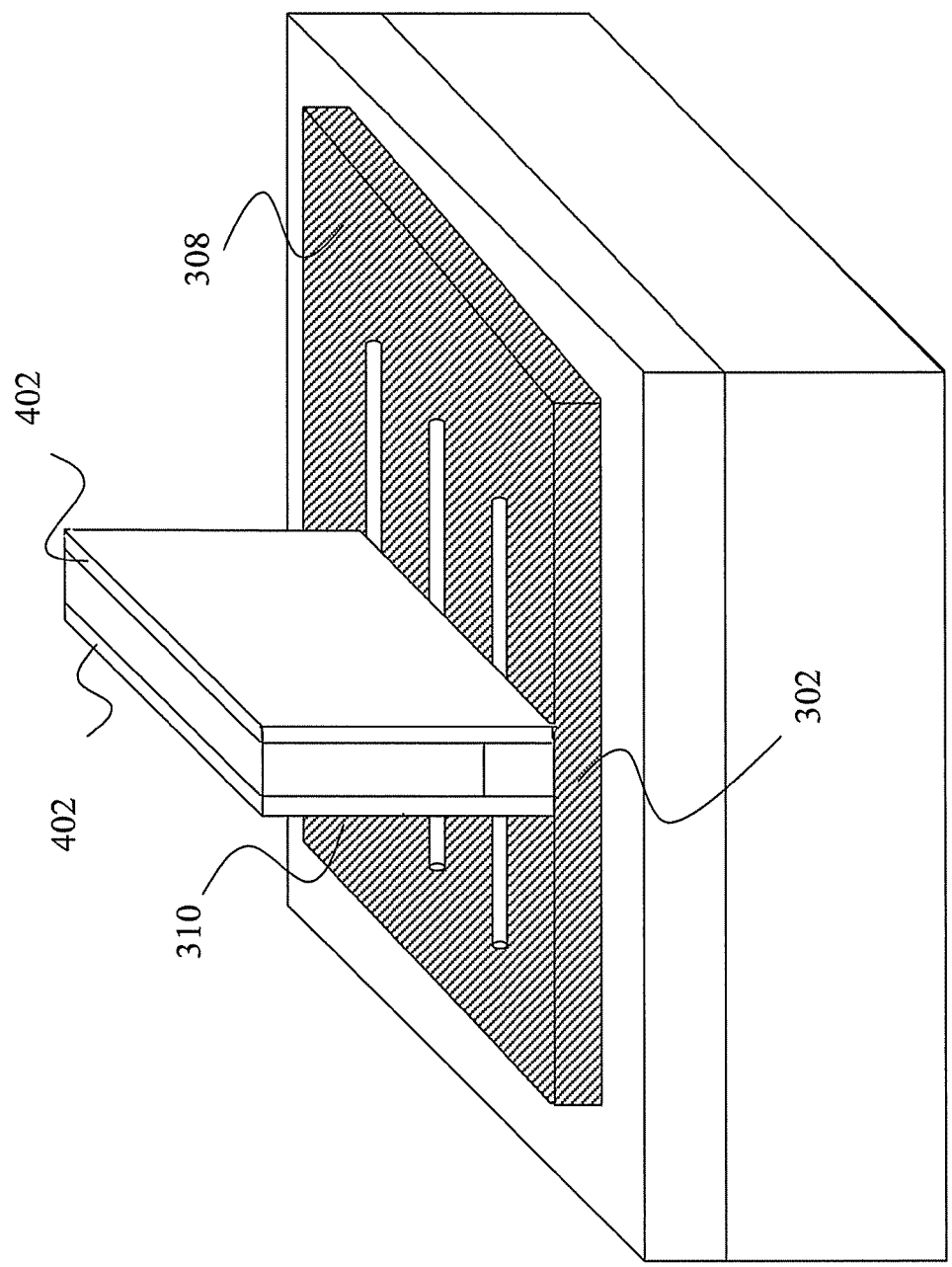
FIG. 4 shows the structure of FIG. 3 after spacers have been formed on the sidewalls of the gate stack.

FIG. 4 shows the structure of FIG. 3 after spacers 402 have been formed on the sidewalls of the gate stack 302. In FIG. 4 (and FIG. 5 below), the portion of the gate stack 302 (and the spacers 402 formed on its side) extending beyond the active region are not shown in order to illustrate the structure more clearly.

The spacers 402 may be formed, for example, by a conform material deposition followed by an anistropic etch. In one embodiment, the spacers 402 are formed of a silicon nitride material.

Figure 5:
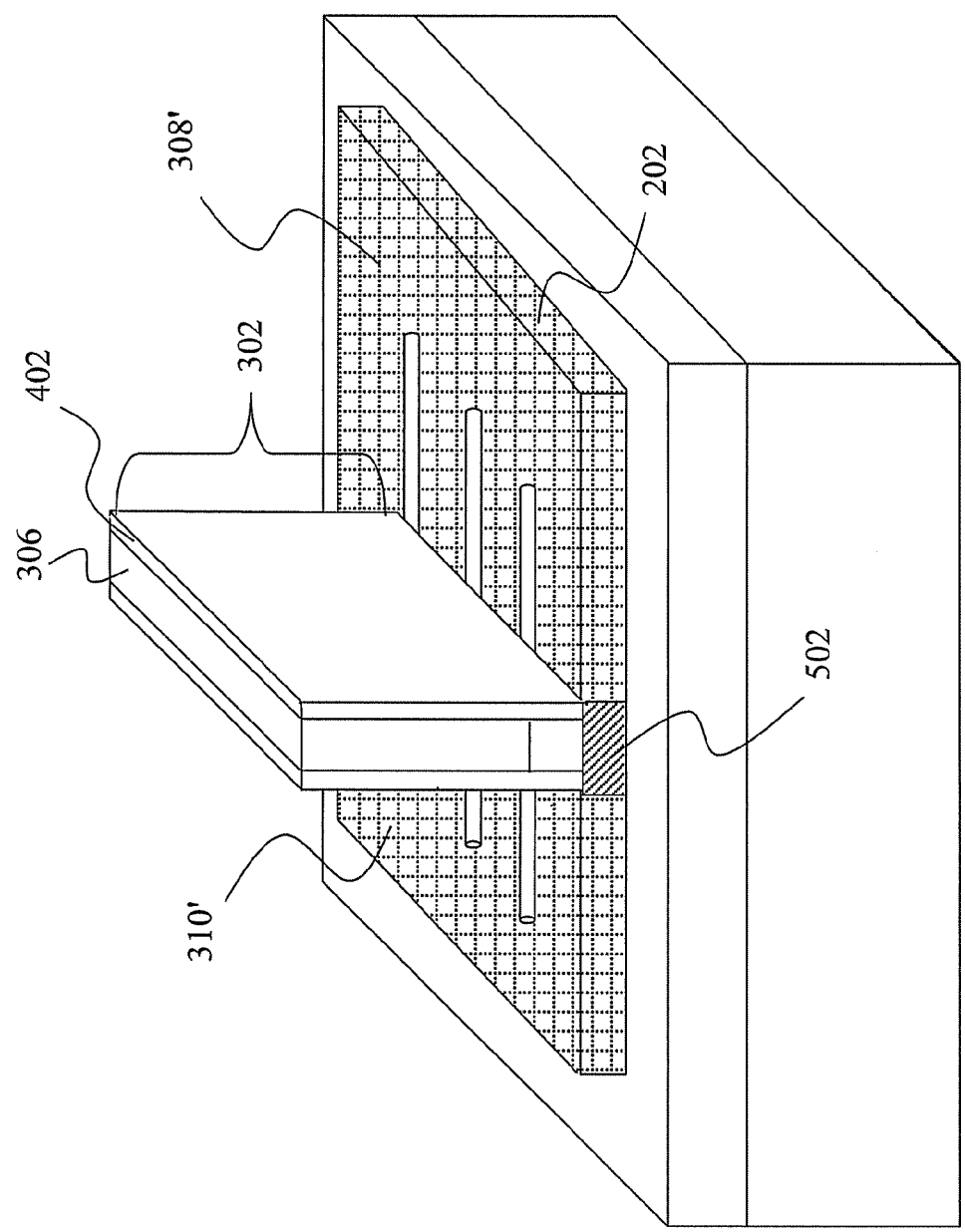
FIG. 5 shows the structure of FIG. 4 after the carbon first portion and carbon second portion have been converted to a metal carbide.

FIG. 5 shows the structure of FIG. 4 after the carbon first portion 308 and carbon second portion 310 have been converted to a metal carbide. The structure shown in FIG. 5 may be (with addition of one or more connectors) operated as a FET. The metal carbide first portion 308' and the metal carbide second portion 310' are separated by an insulating carbon portion 502. The insulating carbon portion 502 is formed by the portion of the active region 202 that is covered by the gate stack 302 and spacers 402.

The first portion 308 and carbon second portion 310 may be converted to the metal carbide first portion 308' and the metal carbide second portion 310' by depositing a metal over the structure of FIG. 4, annealing to a temperature high enough to for the metal and carbon to react, and etching the remaining unreacted metal to form a metal carbide from the first portion 308 and the second portion 310. To enable this process, the metal must not react with the spacers formed on the gate sidewall. The metal may or may not react with the exposed portions of the deposited nanostructures 108. The metal may or may not react with the gate material. Removal of the un-reacted metal must be performed selectively to the gate metal, metal carbide, spacers, and any other expose material on the wafer.

The metal carbide first portion 308' may form a source contact and the metal carbine second portion 310' may form a drain contract, or vice versa, to the portion of the nanostructure 108 that is underneath the gate. Regardless, the source and drain are separated by insulating carbon portion 502. Accordingly, in the absence of an external voltage applied to the gate 306, the source and drain are electrically separated.

A portion of the nanostructure 108 is under the gate stack 302. Application of a voltage to the gate 306 will cause that portion of the nanostructure 108 under the gate stack 302 to become conductive. Once conductive, the nanostructure 108 electrically couples the metal carbide first portion 308' and the metal carbide second portion 310' and allows for current to pass between them.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A field effect transistor comprising:
   a continuous carbon layer having a metal carbide source portion, a metal carbide drain portion and an insulating carbon portion between the metal carbide source portion from the metal carbide drain portion, wherein a top of the metal carbide source portion, a top of the metal carbide drain portion and a top of the insulating carbon portion are coplanar;
   a nanostructure formed over the insulating carbon portion and connecting the metal carbide source portion to the metal carbide drain portion; and
   a gate stack formed on over at least a portion of the insulating carbon portion and at least a portion of the nanostructure.

2. The field effect transistor of claim 1, further comprising:
   a substrate; and
   an insulating layer formed between the substrate and the metal carbide source portion, the metal carbide drain portion and the insulating carbon portion.

3. The field effect transistor of claim 1, wherein the insulating carbon portion is formed of a diamond, a diamondlike, or an amorphous carbon material.

4. The field effect transistor of claim 3, wherein the insulating carbon portion is a crystalline diamond film, a polycrystalline diamond film, a nanocrystaline diamond film, ultra-nanocrystalline diamond film, a diamondlike hydrogenated carbon film, or a tetrahedral carbon film.

5. The field effect transistor of claim 4, wherein the insulating carbon portion includes atoms of N, Si, Ge, or F.

6. The field effect transistor of claim 1, wherein the metal carbide source portion, the metal carbide drain portion and the insulating carbon portion are coplanar.

7. The field effect transistor of claim 1, wherein the nanostructure is a carbon nano structure.

8. The field effect transistor of claim 7, wherein the carbon nanostructure is one of carbon nanotube, a carbon nanowire, or graphene.

9. The field effect transistor of claim 8, wherein the carbon nanostructure is conductive when a voltage is applied to the gate stack and non-conductive when a voltage is not applied to the gate stack.

10. The field effect transistor of claim 1, wherein the metal carbide is formed from one of Mo, W, or Ti.

* * * * *